United States Patent
Koenck et al.

(10) Patent No.: US 9,117,722 B1
(45) Date of Patent: Aug. 25, 2015

(54) IMAGE SENSOR INTEGRATED CIRCUIT

(71) Applicants: Steven E. Koenck, Cedar Rapids, IA (US); David W. Jensen, Marion, IA (US); Robert G. Brown, Tustin, CA (US)

(72) Inventors: Steven E. Koenck, Cedar Rapids, IA (US); David W. Jensen, Marion, IA (US); Robert G. Brown, Tustin, CA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/019,288

(22) Filed: Sep. 5, 2013

Related U.S. Application Data

(63) Continuation-in-part of application No. 13/690,276, filed on Nov. 30, 2012, now Pat. No. 8,829,452, which is a continuation-in-part of application No. 13/360,570, filed on Jan. 27, 2012, now Pat. No. 8,772,729, which is a continuation-in-part of application No. 13/243,342, filed on Sep. 23, 2011, now Pat. No. 8,969,850.

(51) Int. Cl.
| | |
|---|---|
| *H01L 31/052* | (2014.01) |
| *H01L 27/146* | (2006.01) |
| *H01L 27/148* | (2006.01) |
| *H01L 31/20* | (2006.01) |
| *B82Y 20/00* | (2011.01) |

(52) U.S. Cl.
CPC .... *H01L 27/14641* (2013.01); *H01L 27/14806* (2013.01); *H01L 31/20* (2013.01); *B82Y 20/00* (2013.01); *Y10S 977/773* (2013.01); *Y10S 977/89* (2013.01); *Y10S 977/954* (2013.01)

(58) Field of Classification Search
CPC .............. H01L 31/035227; H01L 31/035218
USPC ...................... 257/20–22, 186, 428, E31.003; 250/370.07
See application file for complete search history.

(56) References Cited

U.S. PATENT DOCUMENTS

| | | | |
|---|---|---|---|
| 4,814,847 | A | 3/1989 | Tabatabaie |
| 4,814,874 | A | 3/1989 | Adachi |
| 5,949,071 | A | 9/1999 | Ruffner et al. |
| 8,089,115 | B2 | 1/2012 | Leong et al. |
| 8,492,727 | B1 | 7/2013 | Brown et al. |

(Continued)

FOREIGN PATENT DOCUMENTS

| | | |
|---|---|---|
| RU | 2374720 C1 | 11/2009 |
| RU | 101866 U1 | 1/2011 |

(Continued)

OTHER PUBLICATIONS

U.S. Appl. No. 13/243,342, filed Sep. 23, 2011, Rockwell Collins, Inc.

(Continued)

*Primary Examiner* — Thomas L Dickey
(74) *Attorney, Agent, or Firm* — Angel N. Gerdzhikov; Donna P. Suchy; Daniel M. Barbieri

(57) ABSTRACT

An integrated circuit (IC) sensor is described. The IC sensor includes a pixel array and IC components. The pixel array has a plurality of pixels, wherein each pixel includes an EMR absorption region including a detector material having a plurality of nanoparticles embedded in a matrix material and exhibiting a nano-plasmonic property. The IC components are arranged to provide amplification of a voltage signal from the EMR absorption region, and to select the voltage signal from the EMR absorption region.

19 Claims, 7 Drawing Sheets

(56) References Cited

U.S. PATENT DOCUMENTS

| | | | |
|---|---|---|---|
| 2006/0108657 A1* | 5/2006 | Raynor | 257/438 |
| 2007/0289623 A1 | 12/2007 | Atwater | |
| 2009/0103095 A1* | 4/2009 | Beausoleil et al. | 356/406 |
| 2009/0152664 A1* | 6/2009 | Klem et al. | 257/440 |
| 2010/0058978 A1 | 3/2010 | Nikoobakht | |
| 2010/0124053 A1 | 5/2010 | Wu et al. | |
| 2010/0127172 A1 | 5/2010 | Nikoobakht | |
| 2011/0215298 A1 | 9/2011 | Kim et al. | |
| 2011/0278541 A1 | 11/2011 | Huang et al. | |
| 2012/0280209 A1 | 11/2012 | Bonnell et al. | |
| 2013/0075699 A1 | 3/2013 | Brown et al. | |

FOREIGN PATENT DOCUMENTS

| | | |
|---|---|---|
| WO | WO-2008/135905 | 11/2008 |
| WO | WO-2009/104188 | 8/2009 |

OTHER PUBLICATIONS

U.S. Appl. No. 13/360,570, filed Jan. 27, 2012, Rockwell Collins, Inc.

U.S. Appl. No. 13/690,276, filed Nov. 30, 2012, Rockwell Collins, Inc.

Anderson, Surface Enhanced Infrared Absorption by Coupling Photon and Plasmon Resonance, Applied Physics Letters, 2005, 4 pages.

Campbell, Optoelectronic Technology and Lightwave Communication Systems, Van Nostrand Reinhold, 1989, 40 pages.

Knight et al., Photodetection with Active Optical Antennas, May 6, 2011, 5 pages.

McIntyre, Recent Developments in Silicon Avalanche Photodiodes, Measurement, 1985, 7 pages.

McIntyre, The Distribution of Gains in Uniformly Multiplying Avalanche Photodiodes: Theory, IEEE Transactions on Electron Devices, Jun. 1972, 11 pages.

Miyachi et al., A Photosensing System Composed of Photosystem I, Molecular Wire, Gold Nano-Particle, and Double Surfactants in Water, 2010, 3 pages.

Radford et al., Sensitivity Improvements in Uncooled Microbolometer FPAs, 1999, 12 pages.

Rogalski, Selected Papers on Infrared Detectors: Developments, 2004.

Saleh et al., Fundamentals of Photonics, 1991, 4 pages.

Sonnichsen et al., Drastic Reduction of Plasmon Damping in Gold Nanorods, 2002, 4 pages.

Wokaun, Surface Enhancements of Optical Fields, 1985, 34 pages.

Yamaguchi et al., Optical Effect of the Substrate on the Anomalous Absorption of Aggregated Silver Films, 1974, 15 pages.

Zayats et al., Nano-Optics of Surface Plasmon Polaritons, 2005, 184 pages.

Zhao et al., The Extinction Spectra of Silver Nanoparticle Arrays: Influence of Array Structure on Plasmon Resonance Wavelength and Width, 2003, 8 pages.

Office Action for U.S. Appl. No. 13/243,342, mail date Sep. 19, 2013, 8 pages.

Office Action for U.S. Appl. No. 13/360,570, mail date Oct. 9, 2013, 11 pages.

International Search Report and Written Opinion for Application No. PCT/US2012/035112, mail date Jun. 28, 2012, 5 pages.

Notice of Allowance on U.S. Appl. No. 13/360,570 Dated Mar. 19, 2014, 5 pages.

Office Action on U.S. Appl. No. 13/690,276 Dated Mar. 7, 2014, 11 pages.

Office Action on U.S. Appl. No. 13/690,276 Dated Apr. 10, 2014, 16 pages.

Novotny, "The History of Near-field Optics", from Progress in Optics 50, chapter 5, p. 137-184 (Elsevier, Amsterdam, The Netherlands, 2007).

* cited by examiner

IMAGE SENSOR INTEGRATED CIRCUIT

RELATED APPLICATIONS

This application is a continuation-in-part application of U.S. application Ser. No. 13/690,276, filed Nov. 30, 2012, entitled VIS-NIR PLASMONIC APD DETECTORS, which is a continuation-in-part application of U.S. application Ser. No. 13/360,570, filed Jan. 27, 2012, entitled APDs USING NANO-PLASMONIC METAMATERIALS, which is a continuation-in-part application of U.S. application Ser. No. 13/243,342, filed Sep. 23, 2011, entitled NANO-STRUCTURE ARRAYS FOR EMR IMAGING, the entire contents of which are incorporated by reference.

FIELD OF THE INVENTION

The present disclosure relates to an image sensor incorporating a nano-plasmonic structure in an integrated circuit, such as a CMOS (complimentary metal-oxide-semiconductor) integrated circuit, or a CCD (charge coupled device) integrated circuit.

BACKGROUND

Image sensors using CMOS architecture, or CCD architecture, are known. For example, a CMOS active-pixel sensor (APS) typically includes an array of pixel sensors, where each pixel has a photodetector and an active amplifier. Such a CMOS image sensor is produced by a CMOS process. Electromagnetic radiation (EMR), such as visible light, impinging upon a pixel, is converted to electrons and sensed by the pixel. Circuitry next to each photodetector of a pixel converts the light energy to a voltage.

Image sensors are limited to sensing EMR within a wavelength band or bands, to which the pixel material is sensitive. For example, typical pixel sensors are made of silicon, and are sensitive to EMR wavelengths to which silicon is responsive. Sensing other wavelengths such as short-wave infrared (SWIR), mid-wave infrared (MWIR) or long-wave infrared (LWIR), is generally not possible with a silicon based CMOS image sensing array.

SUMMARY OF THE INVENTION

According to one embodiment, there is provided an integrated circuit (IC) sensor, comprising: a pixel array comprising a plurality of pixels, wherein each pixel comprises an EMR absorption region comprising a detector material having a plurality of nanoparticles embedded in a matrix material and exhibiting a nano-plasmonic property; and IC components arranged to provide amplification of a voltage signal from the EMR absorption region, and to select the voltage signal from the EMR absorption region.

According to one aspect of the embodiment, the pixel array comprises a semiconductor substrate.

According to another aspect of the embodiment, the semiconductor substrate comprises at least one of a IV semiconductor, a IV-VI semiconductor, a II-VI semiconductor, or a III-V semiconductor.

According to another aspect of the embodiment, the IC sensor is a charge coupled device (CCD) sensor.

According to another aspect of the embodiment, the IC sensor is a complimentary metal-oxide-semiconductor (CMOS) sensor, and the IC components are CMOS components.

According to another aspect of the embodiment, the CMOS components are arranged in a five transistor arrangement.

According to another aspect of the embodiment, the CMOS components include a source follower transistor arranged to provide amplification of the voltage signal from the EMR absorption region.

According to another aspect of the embodiment, the CMOS components include a select transistor arranged to select the voltage signal from the EMR absorption region.

According to another aspect of the embodiment, the matrix material comprises a first matrix material and a second matrix material.

According to another aspect of the embodiment, the first matrix material comprises a doped silicon well region contacting the nano-particles.

According to another aspect of the embodiment, the doped silicon well region comprises a n-well contacting the nano-particles.

According to another aspect of the embodiment, the doped silicon well region comprises a n-well and a p-well on the n-well, the p-well contacting the nano-particles.

According to another aspect of the embodiment, the second matrix material comprises an amorphous silicon layer contacting the nano-particles and the first matrix material.

According to another aspect of the embodiment, the IC sensor further comprises a doped contact on the well region.

According to another aspect of the embodiment, the IC sensor further comprises a doped contact on the amorphous silicon layer.

According to another aspect of the embodiment, the IC sensor further comprises a metal interconnect contacting the doped contact.

According to another aspect of the embodiment, the IC sensor further comprises a p+ doped contact on the p-well, and a n+ doped contact on the n-well.

According to another aspect of the embodiment, the nano-particles are formed of gold, silver, aluminum, oxides, or nitrides.

According to another aspect of the embodiment, the shape of the nano-particles is one of cylindrical, spherical, cubic, rectangular-cubic, ellipsoidal, planar, chevrons, slots, near-planar or spiral-twisted.

According to another aspect of the embodiment, the IC sensor further comprises row access drivers configured to access rows of the pixel array.

According to another aspect of the embodiment, the IC sensor further comprises a column amplifier configured to amplify a signal from pixels in columns of the pixel array.

According to another aspect of the embodiment, the nano-particles are arranged in a substantially regular array.

According to another embodiment, there is provided a method of forming an integrated circuit (IC) sensor, comprising: forming an IC region comprising an IC component on a substrate; and forming a plasmonic pixel region on the substrate, comprising: forming a first matrix material in the substrate; forming a plurality of nano-particles contacting the first matrix material; and forming a second matrix material contacting the first matrix material and the plurality of nano-particles, wherein the first matrix material and the second matrix material together form a matrix material which embeds the nano-particles, such that matrix material together with the nano-particles exhibit a nano-plasmonic property.

According to an aspect of the one embodiment, the substrate comprises a semiconductor substrate.

According to another aspect of the one embodiment, the semiconductor substrate comprises at least one of a IV semiconductor, a IV-VI semiconductor, a II-VI semiconductor, or a III-V semiconductor.

According to another aspect of the one embodiment, the IC sensor is a charge coupled device (CCD) sensor.

According to another aspect of the one embodiment, the IC sensor is a complimentary metal-oxide-semiconductor (CMOS) sensor, and the IC component is a CMOS component.

According to another aspect of the embodiment, the method further comprises: forming a dielectric passivation layer on the first matrix material; and forming a window in the dielectric passivation layer to expose the first matrix material.

According to another aspect of the embodiment, the forming the first matrix material comprises implanting the substrate to form a doped silicon well region.

According to another aspect of the embodiment, the method further comprises implanting to form a doped contact on the doped silicon well region.

According to another aspect of the embodiment, the implanting comprises implanting to form a n-well.

According to another aspect of the embodiment, the implanting further comprises implanting to form a p-well on the n-well.

According to another aspect of the embodiment, the method further comprises: implanting to form a p+ doped contact on the p-well; and implanting to form a n+ doped contact on the n-well.

According to another aspect of the embodiment, the forming the second matrix material comprises forming a doped amorphous silicon layer.

According to another aspect of the embodiment, the method further comprises: implanting to form a doped contact on the amorphous silicon layer.

According to another aspect of the embodiment, the forming the plurality of nano-particles comprises: depositing a nano-particle material on the first matrix material; and patterning the nano-particle material to form the plurality of nano-particles.

According to another aspect of the one embodiment, the patterning the nano-particle material comprises performing electron beam lithography on the nano-particle material.

According to another aspect of the one embodiment, the nano-particles are formed of gold, silver, aluminum, oxides, or nitrides.

According to another aspect of the one embodiment, the shape of the nano-particles is one of cylindrical, spherical, cubic, rectangular-cubic, ellipsoidal, planar, chevrons, slots, near-planar or spiral-twisted.

According to another aspect of the one embodiment, the nano-particles are arranged in a substantially regular array.

DETAILED DESCRIPTION OF THE INVENTION

Figure 1:
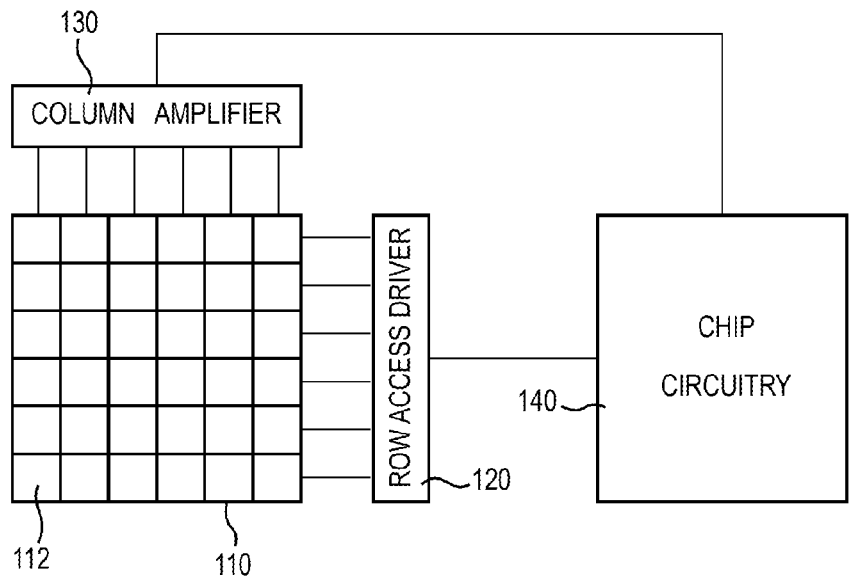
FIG. 1 is a schematic illustrating a image sensor integrated circuit according to an embodiment of the invention.

The sensors described herein incorporate integrated circuit processing, such as a CMOS process with the formation of nano-plasmonic structures for detection of EMR in a desired wavelength range, which allows for detection of wavelengths over several regions of the EMR spectrum according to one embodiment. The use of appropriately chosen nano-plasmonic structures allow EMR detection in the UV, visible, SWIR, MWIR and LWIR regions according to one embodiment. The electrons generated by EMR absorption by the nano-plasmonic structures provide a detectable signal that can be sensed electronically with appropriate amplification, discrimination and signal processing according to one embodiment. By incorporating nano-plasmonic structures with circuits on a CMOS integrated circuit, it is possible to create a monolithic, uncooled semiconductor device that is responsive to a complete range of UV, visible, and IR wavelengths according to one embodiment.

In an embodiment of the present invention, the pixel sensor material for sensing EMR includes nanostructure, such as nano-particles having an appropriate geometry (size, shape, orientation and spacing), embedded in a matrix material, so that the sensor material is sensitive to EMR in a desired wavelength range. The present inventors have found that by appropriately selecting the geometry and materials for a detector material comprising a substantially regular array of nanoparticles embedded in a matrix material, and by applying an appropriate bias voltage to the matrix material, a direct electrical current may be generated based on a cooperative plasmon effect in the detector material when EMR in a desired wavelength range is incident upon the detector material, and where the dominant mechanism for decay in the cooperative plasmon effect is nonradiative according to one embodiment. Thus the detector material, comprising the substantially regular array of nanoparticles embedded in the matrix material, has a nano-plasmonic property, where the nano-plasmonic property means that when an appropriate bias voltage is applied to the matrix material, a direct electrical current may be generated based on a cooperative plasmon effect in the detector material when EMR in a desired wavelength range is incident upon the detector material, and where the dominant mechanism for decay in the cooperative plasmon effect is nonradiative. The detector material may be arranged in an EMR absorption region of the detection device.

An important concept in certain embodiments of the nano-plasmonics detector designs disclosed here is the replacement of the currently ubiquitous semiconductor EMR absorption region, by a lattice structured nano-plasmonic meta-material absorber. The concept of a lattice structured nano-plasmonic meta-material absorber is described in detail in U.S. Application No. 13,243,342, filed Sep. 23, 2011, entitled NANOSTRUCTURE ARRAYS FOR EMR IMAGING, incorporated by reference herein in its entirety. The concept of a nano-plasmonic detector using gold nanoparticles is described in U.S. application Ser. No. 13,360,570, filed Jan. 27, 2012, entitled APDs USING NANO-PLASMONIC METAMATERIALS, incorporated by reference herein in its entirety. The concept of a nano-plasmonic detector using silver or aluminum nano-particles is described in U.S. Application No. 13/690,276, filed Nov. 30, 2012, entitled VIS-NIR PLASMONIC APD DETECTORS, incorporated by reference herein in its entirety. The nano-plasmonic designs disclosed here allow for EMR absorption in the nano-particles under conditions sufficient to release electrons through a modified Schottky barrier unipolar transport process. An important aspect of the structure is its characteristic long decay-time of the collective interactions, which enable the electrons to interact with the Schottky barrier.

FIG. 1 is a schematic illustrating an integrated circuit (IC) sensor 100 according to an embodiment of the invention. The sensor includes a pixel array 110 having a number of pixels 112. Each of the pixels 112 have nano-plasmonic structures for EMR detection, and in particular include an EMR absorption region comprising a detector material. The sensor 100 further includes row access drivers 120 for accessing rows of the pixel array 110, and a column amplifier 130 to amplify the signal from pixels in columns of the pixel array 110. Chip circuitry 140 controls the row access drivers 120 and column amplifier 130, and receives a signal from the column amplifier 130. The column amplifier 130 provides an EMR detection signal to the chip circuitry 140. The chip circuitry 140 provides functions such as signal processing of the pixel array 110 amplified signals, analog to digital conversion, and timing, for example, such as is known for IC sensors, such as CMOS sensors.

Figure 2A:
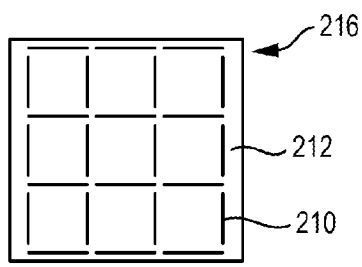
FIGS. 2A, 2B and 2C respectively illustrate a detector having different polarization geometries showing nano-particle arrays with respectively a checker-board geometry, a parallel array geometry, and different parallel array geometries placed in different quadrants in a single pixel.
Figure 2B:
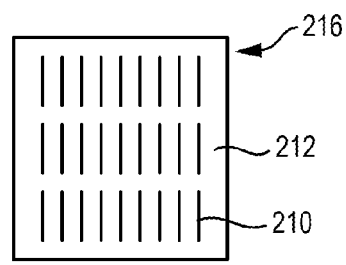
Figure 2C:
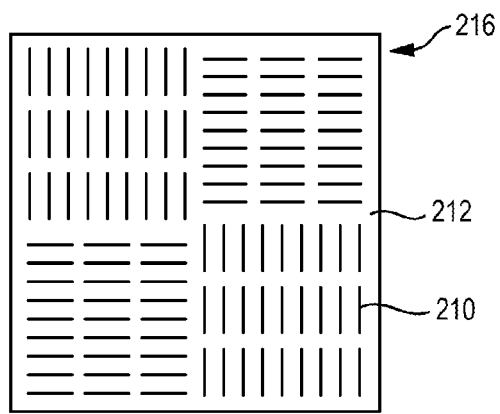

FIGS. 2A, 2B, and 2C illustrate nano-particle arrangement geometries showing nanoparticles 210 in a matrix material 212 of a pixel 216. The following nanoparticle geometries may be calculated fairly accurately for their polarization and wavelength discrimination potential advantages. FIGS. 2A, 2B, and 2C illustrate different polarization geometries.

The geometry of FIG. 2A offers the possibility of detecting orthogonal 'pure' polarizations within a single pixel by electrically connecting to the rows and columns. FIG. 2B offers the possibility of discriminating a single polarization state in a pixel. FIG. 2C offers the possibility of detecting multiple specific wavelengths, by using nano-particle length variations, and specific polarizations within the same pixel.

FIGS. 3 and 4A-4F are cross-sectional views illustrating an IC region 300, and a plasmonic pixel region 400, respectively, during the manufacturing of the sensor.

Figure 3:
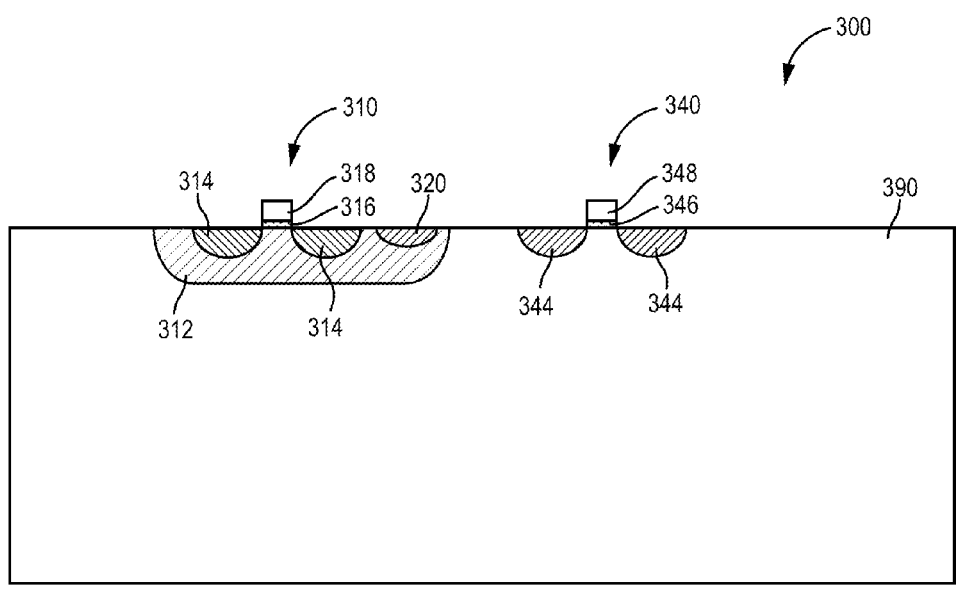
FIG. 3 is a side cross-sectional view of a IC region of a CMOS sensor according to an embodiment of the invention.

FIG. 3 illustrates a standard IC structure, such as a CMOS structure with a P-FET (p type field effect transistor) 310 and a N-FET (N type field effect transistor) 340, prior to connecting wiring being applied. The IC region 300 includes a semiconductor substrate 390, which may be a p-doped Si substrate, or some other semiconductor. The IC region may use any other typical materials such as III-V semiconductors, II-VI semiconductors, IV-VI semiconductors, and IV semiconductors (GaAs, GaN, SiGe, ZnSe, HgCdTe, and Ge for examples). The P-FET 310 includes an active area formed in an n-well 312. The n-well 312 may be formed by an n-type dopant implant into the substrate 390. A gate dielectric 316 and gate 318 are formed, such as by formation of a dielectric and gate material, followed by patterning. The gate material may include polysilicon, for example. Source/drain regions 314 are formed in the n-well 312, for example, by a p+ dopant to implant p+ regions using the gate 318 as an implant mask. Further, a contact region 320 is formed by a n+ implant into the n-well 312.

The N-FET 340 includes a gate dielectric 346 and gate 348 formed, for example, by formation of a dielectric and gate material, followed by patterning. The gate material may include polysilicon, for example. Source/drain regions 344 are formed in the p-doped substrate 390, for example, by a n+ dopant to implant n+ regions using the gate 348 as an implant mask.

In operation, substrate 390 is typically connected to ground (VSS). The n-well 312 is typically connected to the highest positive voltage in the system, so the source/drain 314 and n-well regions 312 are reverse biased and therefore electrically isolated. Source/drain connections and gate connections are typically made by metal interconnects through ohmic n+/p+ contacts.

Figure 4A:
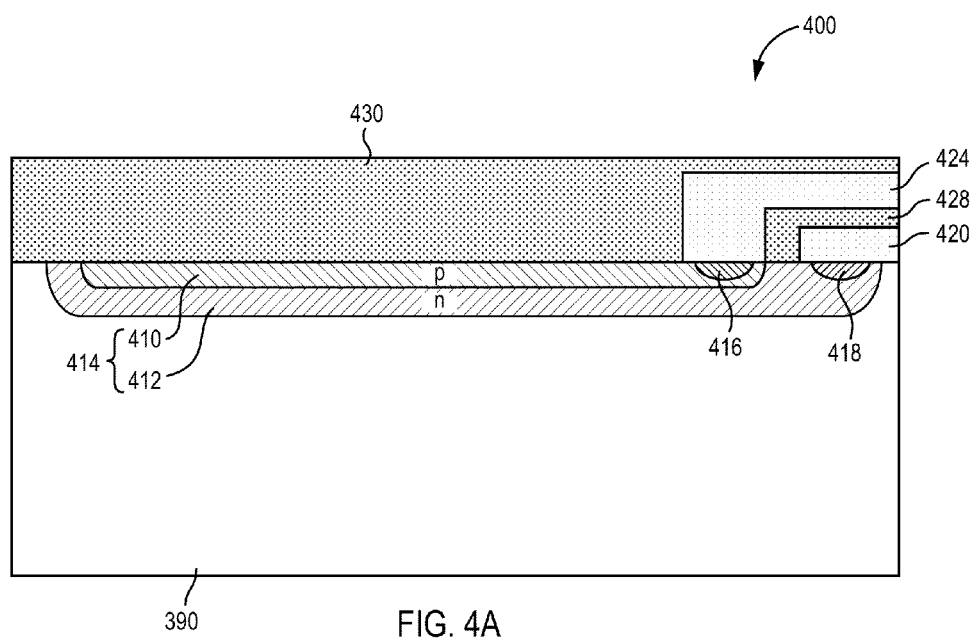
FIGS. 4A-4F are side cross-sectional views of a plasmonic pixel region of a CMOS sensor as steps during manufacture of the sensor according to an embodiment of the invention.

FIGS. 4A-4F illustrates process steps in forming a plasmonic pixel region 400. Referring to FIG. 4A, the plasmonic pixel region 400 includes the semiconductor substrate 390. A first matrix material layer 414 is formed in the substrate 390. The first matrix material layer 414 may comprise a well region, which comprise a n-well 412 and a p-well 410, for example, if it is desired that the nano-particles, described later, be formed on a p region. The n-well 412 may be formed by a n dopant implant. The n-well 412 may be formed at the same time as the n-well 312 shown in FIG. 3, or may be formed in a different implant. The p-well 410 may be formed by a p dopant implant. The p dopant will define the active sensing area of the pixel when plasmonic structures are added.

A p+ contact 416 is made in the p-well 410 by implanting p dopant, for example. Likewise a n+ contact 418 is made in the n-well 412 by implanting n dopant, for example. The p dopant implant may be the same implant process step used to form the PFET source/drain regions 314 in FIG. 3. The n dopant implant may be the same implant process step used to form the NFET source/drain regions 344 in FIG. 3, or contact region 320.

Metal interconnects 420 and 424 are formed to contact the n+ contact 418 and the p+ contact 416, respectively. The metal interconnects 420 and 424 may be formed of Al or Cu for example, and may include vertically aligned plugs of tungsten, for example. An interlevel dielectric 428 is provided to insulate the metal interconnects from each other. The metal interconnects 420 and 424 connect to CMOS logic of the sensor.

Dielectric passivation layer 430 is formed covering the p well 412. The dielectric passivation layer 430 may be a thermal oxide, for example.

While FIG. 4A illustrates the first matrix material layer 414 comprising a well region having a n-well 412 and a p-well 410, if it is desired that the nano-particles, described later, be formed on a n region, the first matrix material layer 414 may comprise only the n-well 412, and there is no need in this case to also form the p-well 410.

Figure 4B:
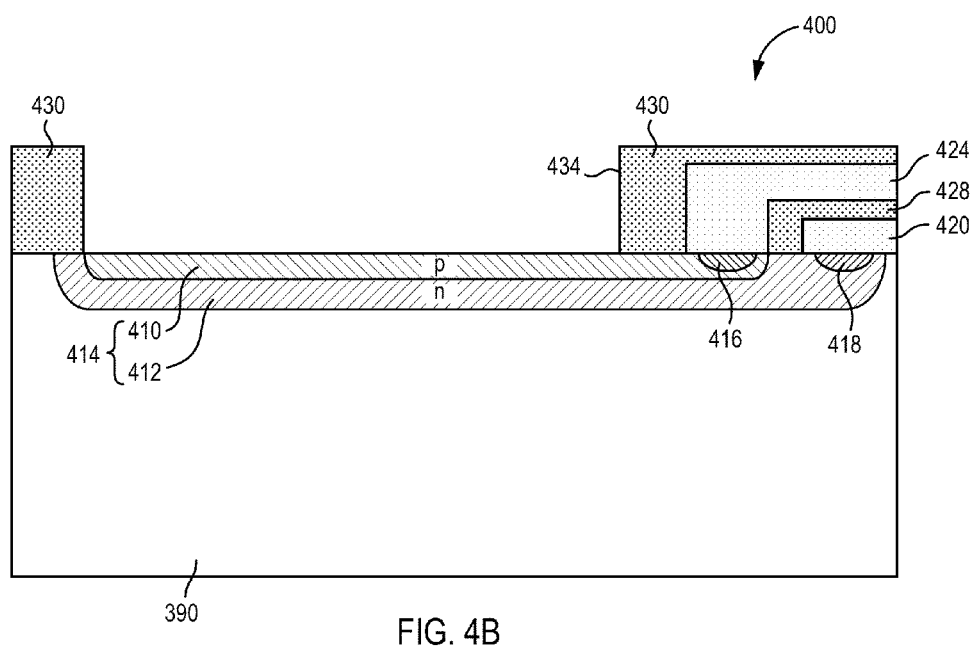

Referring to FIG. 4B, a window 434 is formed in the passivation layer 430. The window 434 may be formed, for example, by photolithographic processing, forming a photoresist etch mask, followed by anisotropic etching using the etch mask, and then removing the etch mask. The window defines the region where the nano-plasmonic structures are formed.

Figure 4C:
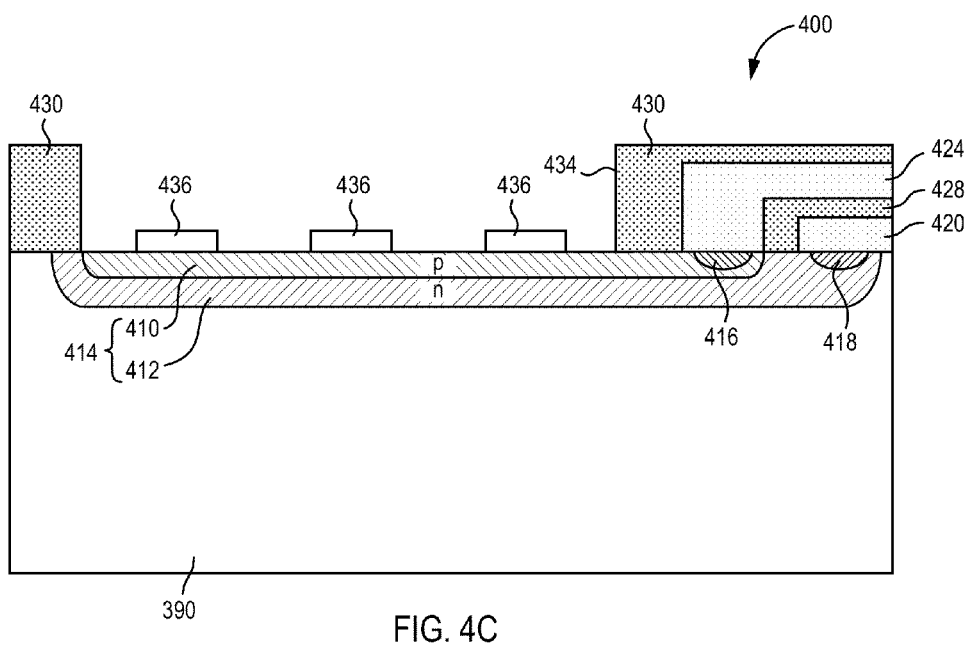

Referring to FIG. 4C nano-particles 436 are formed within the window 434 on the first matrix material layer 414. The nano-particles 436 may be formed of a variety of materials and geometries depending on the desired EMR wavelength range to be detected, as described in detail in U.S. application Ser. No. 13/243,342, filed Sep. 23, 2011, entitled NANO-STRUCTURE ARRAYS FOR EMR IMAGING, incorporated by reference herein in its entirety. The concept of a nano-plasmonic detector using gold nanoparticles is described in U.S. application Ser. No. 13/360,570, filed Jan. 27, 2012, entitled APDs USING NANO-PLASMONIC METAMATERIALS, incorporated by reference herein in its entirety. The concept of a nano-plasmonic detector using silver or aluminum nanoparticles is described in U.S. application Ser. No. 13/690,276, filed Nov. 30, 2012, entitled VIS-NIR PLASMONIC APD DETECTORS, incorporated by reference herein in its entirety.

The nano-particles 436, for example, may comprise gold, aluminum, silver or oxides, for example, depending upon the desired EMR wavelength to be detected. The nano-particles 436 may be formed using a variety of nanolithographic techniques, and may have a variety of shapes such as cylindrical, spherical, cubic, rectangular-cubic, ellipsoidal, planar, chevrons, slots, near-planar or spiral-twisted. As one example, the nano-particles 436 may be gold particles which are 20 nm thick, 20-50 nm wide, and 400 to 1000 nm long. The nano-particles 436 may formed by depositing the material for the nano-particles followed by patterning the nano-particles by electron beam lithography to form an array of nanostructures. Certain nanoscale materials and fabrication processes, such as gold deposited on silicon, may be sensitive to high processing temperatures. In this case, all high temperature semiconductor processing should be completed before any nanoscale fabrication occurs.

The nano-particles 436 should have a good contact to the first matrix material layer 414 to ensure an appropriate nano-plasmonic effect. Therefore any dielectric, such as thermal or native oxide, should be removed prior to forming the nano-particles 436 on the first matrix material layer 414. Further, certain typical seed metals such as titanium that inhibit plasmonic behavior may need to be avoided.

FIG. 4C illustrates just three nano-particles 436 in cross section for ease of illustration. In general, the number of nano-particles would be larger.

Figure 4D:
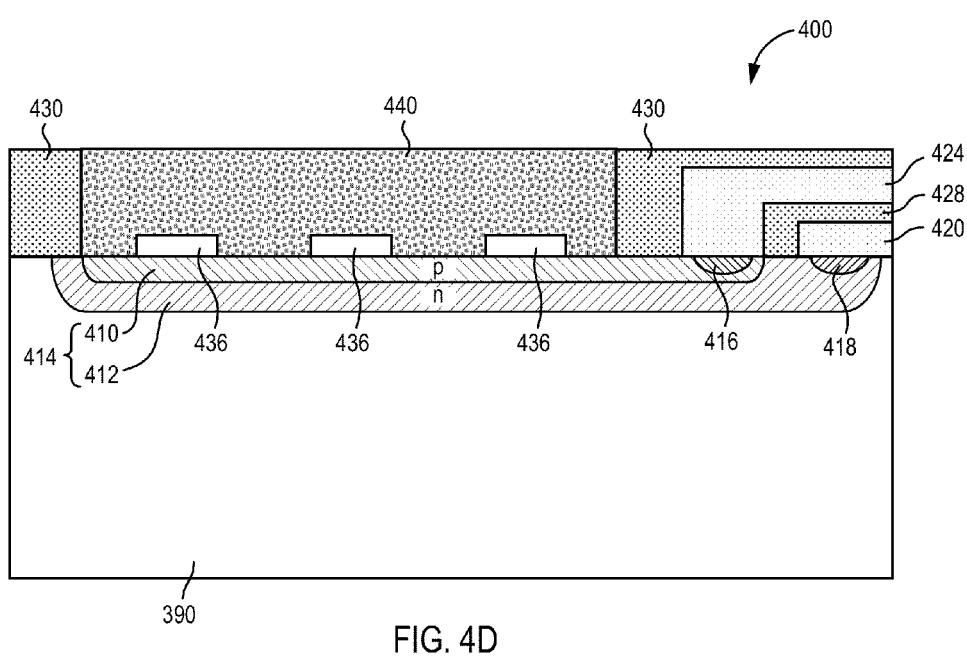

Referring to FIG. 4D, after the nano-particles 436 are fabricated, a second matrix material layer 440, which may be doped amorphous silicon (a-Si), for example, such as n-doped, is applied over and contacts the nano-particles 436 and the first matrix material layer 414. The provision of the second matrix material layer 440 serves three purposes: (1) the nano-particles are completely surrounded by a consistent dielectric material that supports plasmonic resonance; (2) the second matrix material layer 440 is a semiconductor material that forms a Schottky barrier diode interface with the nano-particles, when an appropriate reverse biased is applied, and is thus electrically isolated from the substrate; and (3) the second matrix material layer 440 provides an electrical path to bias the Schottky barrier diodes so that signal current can be detected. Together the second matrix material layer 440 and the first matrix material layer 414 form the matrix material, which embeds the nano-particles 436. Together the matrix material and the nano-particles form the detector material, and define the EMR absorption region of the pixel.

Figure 4E:
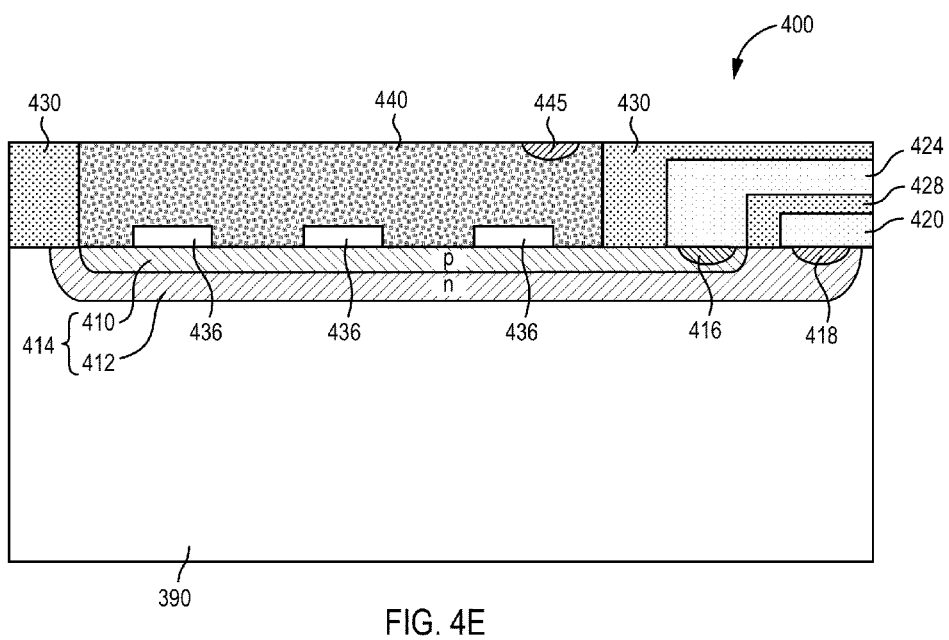

Referring to FIG. 4E, a doped contact region 445 is formed on the second matrix material layer 440 to enable electrical connection to bias the nano-particles 436 and reverse bias the pixel with respect to the semiconductor substrate 390, which is p-doped in this case. When the second matrix material layer 440 is doped amorphous silicon, the doped contact region 445 may be n+ doped, for example, by implanting an n-dopant into the doped amorphous silicon. A positive voltage with respect to the p-doped substrate 390 is needed for reverse bias. The positive bias voltage may allow for simpler electrical interfacing.

Figure 4F:
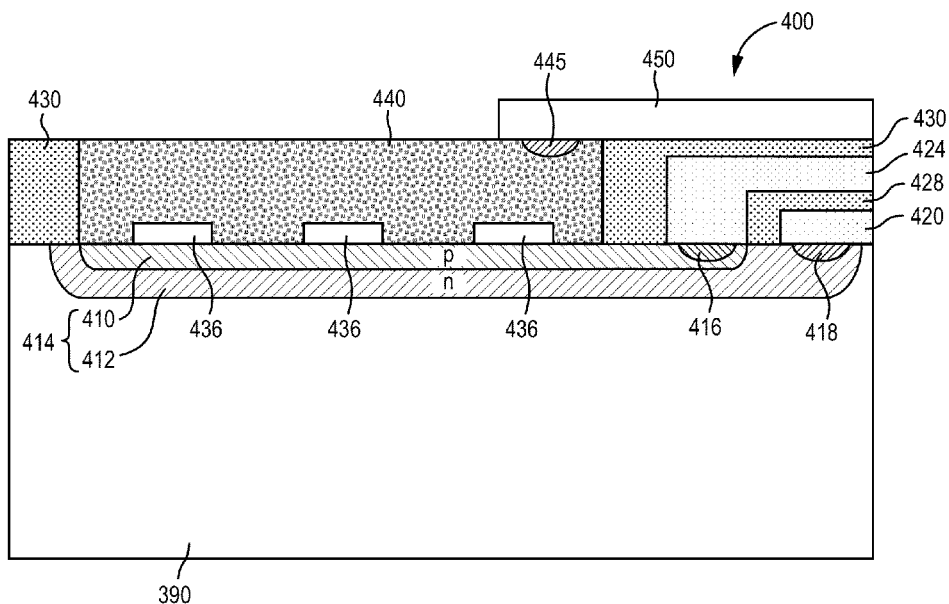

Referring to FIG. 4F, a metal interconnect 450 is formed to electrically contact the pixel at the doped contact region 445. Since the pixel is a two-terminal device; the other connection, metal interconnect 424, is formed to contact the p+ contact 416 below the pixel. The output of the pixel is in the form of photocurrent under bias. When there is no signal (from impinging photons in the wavelengths to which the plasmonic structures resonate), there will be no photocurrent. When a signal is present, the plasmonic resonance causes electrons to exceed the barrier potential and conduct, generating photocurrent that is integrated on the pixel capacitance in typical fashion.

Figure 5:
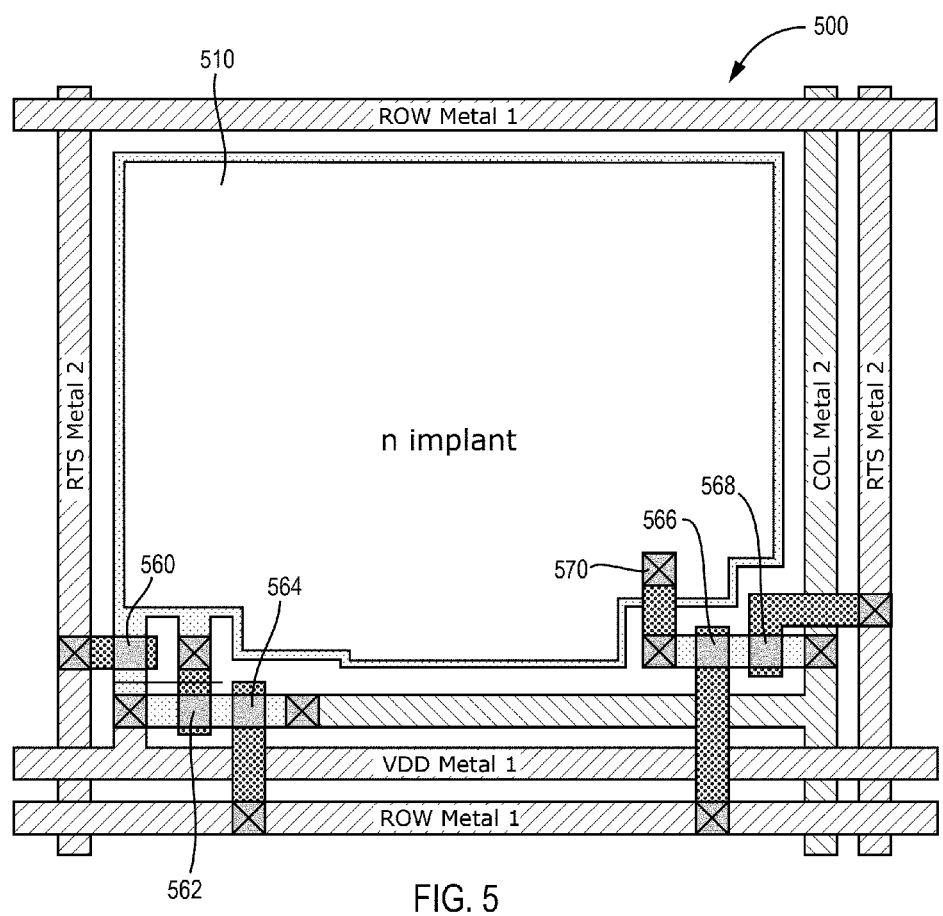
FIG. 5 is a top view schematic illustrating a top view for a notional pixel according to an embodiment of the invention.
Figure 6:
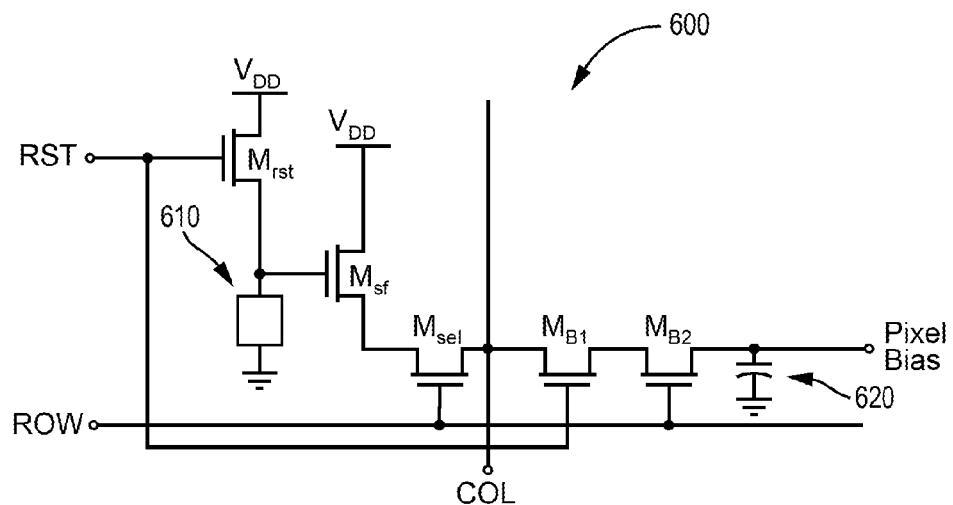
FIG. 6 is a circuit schematic of a standard 3T active pixel structure with additional transistors to bias the EMR region.

FIG. 5 is a top view schematic illustrating a top view for a notional pixel 500 according to an embodiment using to a 5T pixel structure, which provides APS functionality with an active device in each pixel, and allows for multiplexed individual bias control for each pixel. FIG. 6 is a circuit schematic of a 5T pixel structure 600, which is implemented in the notional pixel in FIG. 5. As shown in FIG. 6, the 5T (five transistor) pixel structure 600 has for a particular row, ROW, and column, COL, reset transistor $M_{rst}$, readout transistor (source follower) $M_{sf}$, select transistor $M_{sel}$, bias transistors $M_{B1}$ and $M_{B2}$, capacitor element 620, along with photodetector 610. The 5T pixel structure 600 further is connected with respect to a power supply voltage $V_{DD}$, as shown in FIG. 6. The reset transistor $M_{rst}$ is arranged to act as a switch to reset the photodetector 610. When the reset transistor is turned on, the photodetector is effectively connected to the power supply voltage $V_{DD}$, clearing all integrated charge. The read out transistor, $M_{sf}$, acts as a buffer (source follower), an amplifier which allows the pixel voltage to be observed without removing the accumulated charge. The select transistor, $M_{sel}$, allows a single row of the pixel array to be read by read-out electronics. Together the transistors $M_{rst}$, $M_{sf}$, and $M_{sel}$, which are CMOS components implemented in a CMOS architecture, are configured to provide amplification of the voltage signal from the photodetector 610, and to select the signal from the photodetector 610.

Referring to FIG. 5, the notional pixel 500 includes a EMR absorption region 510, corresponding to the photodetector 610 of FIG. 6, which includes the first matrix material 414 and second matrix material 440 together as the matrix material, and the nano-particles 436 embedded within the matrix material, as seen FIG. 4F. The EMR absorption region 510 corresponds to the photodetector 610 in FIG. 6. The notional pixel 500 further includes metal lines, RST Metal, ROW Metal and COL Metal, to provide the reset RST, ROW and COL signals, respectively. The notional pixel 500 further includes metal line VDD Metal to provide the power supply voltage $V_{DD}$. A pixel bias contact 570 contacts the EMR absorption region 510. In the embodiment shown in FIG. 5, the ROW Metal and VDD Metal are in the level 1 wiring layer above the level 2 wiring layer, which includes the RST Metal, and COL Metal. The notional pixel 500 further includes reset transistor 560, readout transistor (source follower) 562, select transistor 564, and bias transistors 566 and 568 implemented in a CMOS architecture. The metal lines, transistors and EMR absorption region 510 (photodetector) of FIG. 5 are arranged to provide connections in the fashion shown in the circuit of FIG. 6.

The notional pixel 500 of FIG. 5 according to the circuit arrangement of FIG. 6 allows for multiplexed individual bias control for each pixel. The individually controllable bias voltage for each pixel may beneficially improve uniformity of response in the pixel array. The bias transistors $M_{B1}$ and $M_{B2}$ along with the capacitor element 620 allow for an individual pixel to be selected to receive a particular pixel bias voltage. The capacitor element 620 may be implemented via a parasitic capacitance or may be a dedicated capacitor, for example.

In operation to bias a pixel, a voltage may be driven externally by a control circuit onto the shared COL during the pixel reset time, the bias1 transistor $M_{B1}$ is driven on by a voltage applied on the RST, and the bias2 transistor $M_{B2}$ is driven by ROW going high. In the case of the pixel material including amorphous silicon as the matrix material, this operation causes the voltage on COL to be driven onto the amorphous silicon that surrounds the nano-particles. In general, to access the pixels of a column of the array, a voltage is driven to COL, and then rows are sequentially driven by sequentially driving ROW.

In order to provide an appropriate voltage to bias the individual pixels of an M column and N row array, an M×N table may be used, where the table contains the respective values of the voltages driven onto each pixel. That is, the pixel in row i, column j, is driven by the voltage having the value in the ith, jth element of the M×N table. A mechanism of driving the voltages on the pixels may be implemented such that at each frame time the voltage driven on the pixels are refreshed at a full frame rate.

While FIGS. 5 and 6 illustrate a notional pixel according to a 5T design, in general the notional pixel may have other designs, such as 3T, 4T, or 6T for example. For example, a simpler 3T design without the bias transistors $M_{B1}$ and $M_{B2}$ and capacitive element 620 may be employed if a greater fill factor is desired. The 5T design described with the bias transistors $M_{B1}$ and $M_{B2}$ may have a reduced fill factor of the pixel due to the presence of the transistors $M_{B1}$ and $M_{B2}$, where the size of the EMR absorption region 510 is reduced to accommodate for the presence of the transistors $M_{B1}$ and $M_{B2}$. Removing the transistors $M_{B1}$ and $M_{B2}$ would increase the fill factor at the expense of not allowing for the individual pixel biasing in the 5T design.

Figure 7:
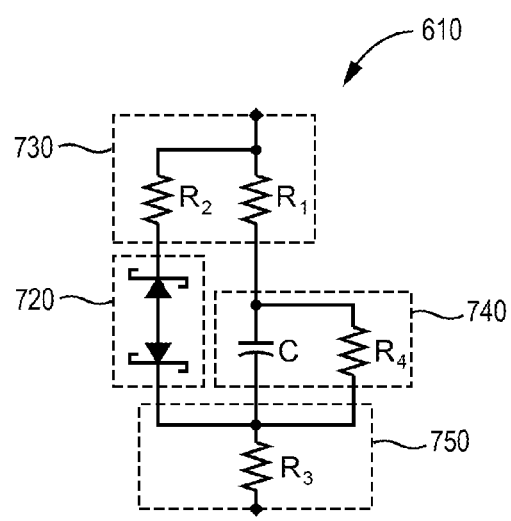
FIG. 7 is a schematic illustrating an equivalent circuit of the EMR absorption region of the notional pixel of FIG. 5.

FIG. 7 illustrates an equivalent circuit of the EMR absorption region 510 in FIG. 5 or photodetector 610 of FIG. 6. The equivalent circuit of FIG. 7 includes a nano-particle region 720, first matrix material region 730, and second matrix material region 750, respectively corresponding to the nano-particles 436, first matrix material 414, and second matrix material 440 of FIG. 4F. For the case where there exists a native oxide between the first matrix material 414, and second matrix material 440, the equivalent circuit of FIG. 7 further includes an oxide region 740. The nano-particle region 720 has schottky diodes between the nano-particles and the first matrix material, and between the nano-particles and the second matrix material, as shown in FIG. 7. The equivalent resistances of the first matrix material region 730, second matrix material region 750, and oxide region 740 are further shown in FIG. 7 as well as the equivalent capacitance of the oxide region 740.

The sensors described herein incorporate the CMOS process with the formation of nano-plasmonic structures for detection of EMR in a desired wavelength range, which allows for detection of wavelengths over several regions of the EMR spectrum in a CMOS process.

The embodiments of the invention have been described in detail with particular reference to preferred embodiments thereof, but it will be understood by those skilled in the art that variations and modifications can be effected within the spirit and scope of the invention.

What is claimed is:

1. An integrated circuit (IC) sensor, comprising:
   a pixel array comprising a plurality of pixels, wherein each pixel comprises an EMR absorption region comprising a detector material having a plurality of nanoparticles embedded in a matrix material and exhibiting a nano-plasmonic property;
   IC components arranged to provide amplification of a voltage signal from the EMR absorption region, and to select the voltage signal from the EMR absorption region,
   wherein the matrix material comprises a first matrix material and a second matrix material,
   wherein the first matrix material comprises a doped silicon well region contacting the nano-particles; and
   a doped contact on the well region.

2. The IC sensor of claim 1, wherein the pixel array comprises a semiconductor substrate.

3. The IC sensor of claim 2, wherein the semiconductor substrate comprises at least one of a IV semiconductor, a IV-VI semiconductor, a II-VI semiconductor, or a III-V semiconductor.

4. The IC sensor of claim 1, wherein the IC sensor is a charge coupled device (CCD) sensor.

5. The IC sensor of claim 1, wherein the IC sensor is a complimentary metal-oxide-semiconductor (CMOS) sensor, and the IC components are CMOS components.

6. The IC sensor of claim 5, wherein the CMOS components are arranged in a five transistor arrangement.

7. The IC sensor of claim 6, wherein the CMOS components include a source follower transistor arranged to provide amplification of the voltage signal from the EMR absorption region.

8. The IC sensor of claim 6, wherein the CMOS components include a select transistor arranged to select the voltage signal from the EMR absorption region.

9. The IC sensor of claim 1,
   wherein the second matrix material comprises an amorphous silicon layer contacting the nano-particles and the first matrix material.

10. The IC sensor of claim 9, further comprising a doped contact on the amorphous silicon layer.

11. The IC sensor of claim 10, further comprising a metal interconnect contacting the doped contact on the amorphous silicon layer.

12. The IC sensor of claim 1, wherein the doped silicon well region comprises a n-well contacting the nano-particles.

13. The IC sensor of claim 1, wherein the doped silicon well region comprises a n-well and a p-well on the n-well, the p-well contacting the nano-particles.

14. The IC sensor of claim 13, further comprising a p+ doped contact on the p-well, and a n+ doped contact on the n-well.

15. The IC sensor of claim 1, wherein the nano-particles are formed of gold, silver, aluminum, oxides, or nitrides.

16. The IC sensor claim 1, wherein the shape of the nano-particles is one of cylindrical, spherical, cubic, rectangular-cubic, ellipsoidal, planar, chevrons, slots, near-planar or spiral-twisted.

17. The IC sensor of claim 1, further comprising:
   row access drivers configured to access rows of the pixel array.

18. The IC sensor of claim 1, further comprising:
   a column amplifier configured to amplify a signal from pixels in columns of the pixel array.

19. The IC sensor of claim 1, wherein the nano-particles are arranged in a substantially regular array.

* * * * *